United States Patent
Kim et al.

(10) Patent No.: US 7,838,390 B2
(45) Date of Patent: Nov. 23, 2010

(54) METHODS OF FORMING INTEGRATED CIRCUIT DEVICES HAVING ION-CURED ELECTRICALLY INSULATING LAYERS THEREIN

(75) Inventors: Jun-jung Kim, Gyeonggi-do (KR);
Joo-chan Kim, Gyeonggi-do (KR);
Jae-eon Park, Gyeonggi-do (KR);
Richard Anthony Conti, Katonah, NY (US); Zhao Lun, Singapore (SG);
Johnny Widodo, Singapore (SG);
William C. Wille, Red Hook, NY (US);
Biao Zuo, Beacon, NY (US)

(73) Assignee: Samsung Electronics Co., Ltd. (KR)

( * ) Notice: Subject to any disclaimer, the term of this patent is extended or adjusted under 35 U.S.C. 154(b) by 419 days.

(21) Appl. No.: 11/871,602

(22) Filed: Oct. 12, 2007

(65) Prior Publication Data
US 2009/0098706 A1   Apr. 16, 2009

(51) Int. Cl.
*H01L 21/76* (2006.01)
(52) U.S. Cl. .............. 438/438; 438/421; 438/423; 438/424; 257/E21.546
(58) Field of Classification Search ............ 438/404, 438/421, 423, 424, 438
See application file for complete search history.

(56) References Cited

U.S. PATENT DOCUMENTS

2007/0210366 A1 * 9/2007 Sandhu et al. ............ 257/305

FOREIGN PATENT DOCUMENTS

| JP | 06-302682 | 10/1994 |
| KR | 1020050002382 A | 1/2005 |
| KR | 1020060104829 A | 10/2006 |

* cited by examiner

*Primary Examiner*—Alexander G Ghyka
(74) *Attorney, Agent, or Firm*—Myers Bigel Sibley & Sajovec

(57) ABSTRACT

Methods of forming integrated circuit devices include forming a trench in a surface of semiconductor substrate and filling the trench with an electrically insulating region having a seam therein. The trench may be filled by depositing a sufficiently thick electrically insulating layer on sidewalls and a bottom of the trench. Curing ions are then implanted into the electrically insulating region at a sufficient energy and dose to reduce a degree of atomic order therein. The curing ions may be ones selected from a group consisting of nitrogen (N), phosphorus (P), boron (B), arsenic (As), carbon (C), argon (Ar), germanium (Ge), helium (He), neon (Ne) and xenon (Xe). These curing ions may be implanted at an energy of at least about 80 KeV and a dose of at least about $5\times10^{14}$ ions/cm$^2$. The electrically insulating region is then annealed at a sufficient temperature and for a sufficient duration to increase a degree of atomic order within the electrically insulating region.

7 Claims, 7 Drawing Sheets

METHODS OF FORMING INTEGRATED CIRCUIT DEVICES HAVING ION-CURED ELECTRICALLY INSULATING LAYERS THEREIN

FIELD OF THE INVENTION

The present invention relates to integrated circuit fabrication methods and, more particularly, to methods of fabricating integrated circuits that utilize trench isolation regions therein.

BACKGROUND OF THE INVENTION

In a semiconductor device, a plurality of unit elements such as transistors, bit lines, or metal wires can be integrated into a substrate. The plurality of unit elements should often be insulated from one another. An insulating film can be used to insulate the unit elements from one another, and an oxide film has been used as a typical insulating film. A BPSG (Boro Phospho Silicate Glass) film, a BSG (Boro Silicate Glass) film, a PSG (Phospho Silicate Glass) film, a TEOS (Tetra Ethyl Ortho Silicate) film, an USG (Undoped Silicate Glass) film, or a combination thereof have also been used as insulating films.

Due to a high degree of integration of the semiconductor device, a distance between patterns thereon is decreased and a height of each pattern may be increased. As a result, an aspect ratio of the pattern may be increased. When a gap is filled during the deposition of an insulating film, an increase in the aspect ratio of the gap may cause defects in the insulating material used to fill the gap.

A HDP (High Density Plasma) oxide film has been used as an insulating film having excellent gap-filling characteristics. However, since the HDP oxide film is formed by a high-density plasma, plasma attack against lower patterns (for example, gate electrode patterns) may be caused by the high-density plasma. Accordingly, a HARP (High Aspect Ratio Planarization) method has been proposed to solve problems generated when an insulating film is deposited by plasma. However, seams may be formed in a material of a HARP oxide film due to the characteristics of the deposition process. Moreover, because a wet etching rate of the HARP oxide film with respect to a hydro-fluoric acid (hereinafter, referred to as "HF") is larger than that of the HDP oxide film, the upper surface of an element isolation film may become recessed to a large depth, thereby generating internal stress within subsequently formed integrated circuit devices.

SUMMARY OF THE INVENTION

Methods of forming an integrated circuit device according to embodiments of the present invention utilize ion implantation and annealing techniques to improve the quality of device isolation regions (e.g., trench isolation regions) within an integrated circuit substrate. Methods according to some of these embodiments include forming a trench in a surface of semiconductor substrate and filling the trench with an electrically insulating region having a seam therein. The trench may be filled by depositing a sufficiently thick electrically insulating layer on sidewalls and a bottom of the trench. Curing ions are then implanted into the electrically insulating region at a sufficient energy and dose to reduce a degree of atomic order therein. The curing ions may be ones selected from a group consisting of nitrogen (N), phosphorus (P), boron (B), arsenic (As), carbon (C), argon (Ar), germanium (Ge), helium (He), neon (Ne) and xenon (Xe). These curing ions may be implanted at an energy of at least about 80 KeV and a dose of at least about $5\times10^{14}$ ions/cm$^2$. The electrically insulating region is then annealed at a sufficient temperature and for a sufficient duration to increase a degree of atomic order within the electrically insulating region.

According to additional embodiments of the invention, the implanting step may be preceded by a step of planarizing a surface of the electrically insulating region. The annealing step may include annealing the electrically insulating region at a temperature of at least about 600° C. for a duration of at least about 30 minutes.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the scope of the invention to those skilled in the art. Like reference numerals refer to like elements throughout the specification.

The term "and/or" includes any and all combinations of one or more of the associated listed items. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terminology used herein is for the purpose of describing particular embodiments only and is not intended to be limiting of the invention.

FIGS. 1A to 1G are views sequentially illustrating methods of manufacturing a semiconductor device according to an embodiment of the present invention. First, referring to FIG. 1A, trenches having high aspect ratios are formed. Specifically, a pad oxide film and a pad nitride film are sequentially laminated. Then, a pad oxide film pattern 112 and a pad nitride film pattern 114 are formed on a semiconductor substrate 100 by using a photomask (not shown) during photo and etching processes. After that, each of the portions of the semiconductor substrate 100, which are exposed to the outside through the pad oxide film pattern 112 and the pad nitride film pattern 114, is etched to have a predetermined depth, thereby forming each of trenches A and B having a high aspect ratio. For convenience of description, the trench A has been shown to have an aspect ratio higher than that of the trench B. However, the present invention is not limited thereto, and the trench A may have the same high aspect ratio as the trench B.

Figure 1A:
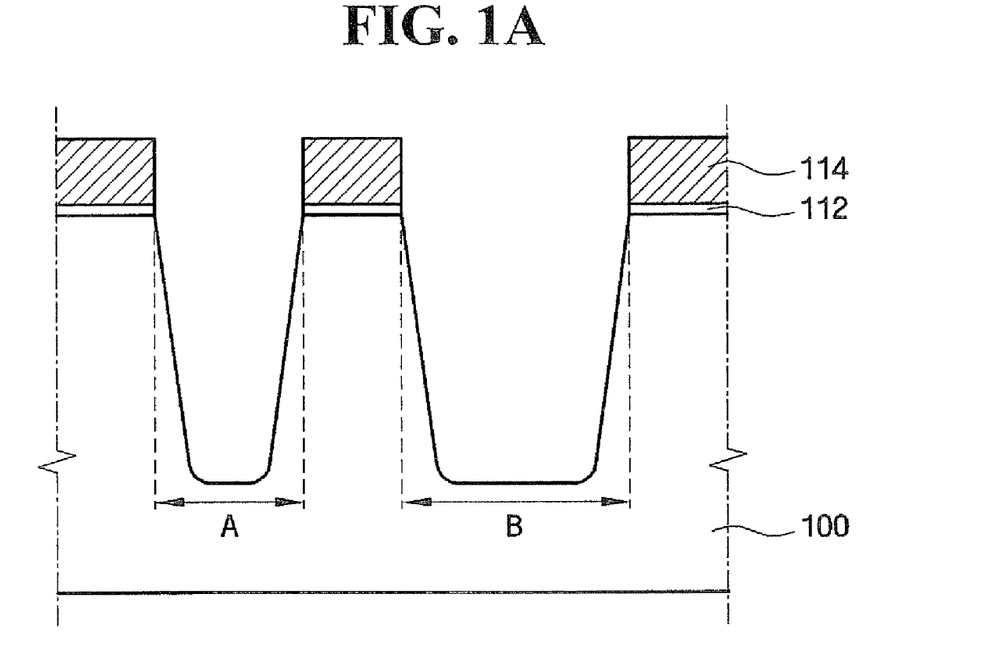
FIGS. 1A to 1G are views sequentially illustrating processes of a method of manufacturing a semiconductor device according to an embodiment of the present invention.

Subsequently, referring to FIG. 1B, a side oxide film 118 is formed in the trenches, and a liner film 120 is formed on the entire surface of the structure of FIG. 1A. The side surfaces of the trenches formed in the semiconductor substrate 100 are thermally oxidized to form the side oxide film 118, which compensates for damage in the surface. Then, a thin nitride film is formed as a liner film 120. The liner film 120 may be formed as a nitride film, which is formed by a low-pressure CVD (chemical Vapor Deposition) method, a plasma derivative CVD method, or a high-density plasma CVD method. For example, the flow amount of a nitrogen source is controlled to change the stress of a thin film into compressive or tensile stress, so that it is possible to improve the properties of the nitride film formed by the plasma derivative CVD method. Further, the stress of the nitride film formed by the high-density plasma CVD method can be adjusted by controlling source power and bias power or the flow amount of gas. Thus, it is possible to selectively form the liner film 120.

Figure 1B:
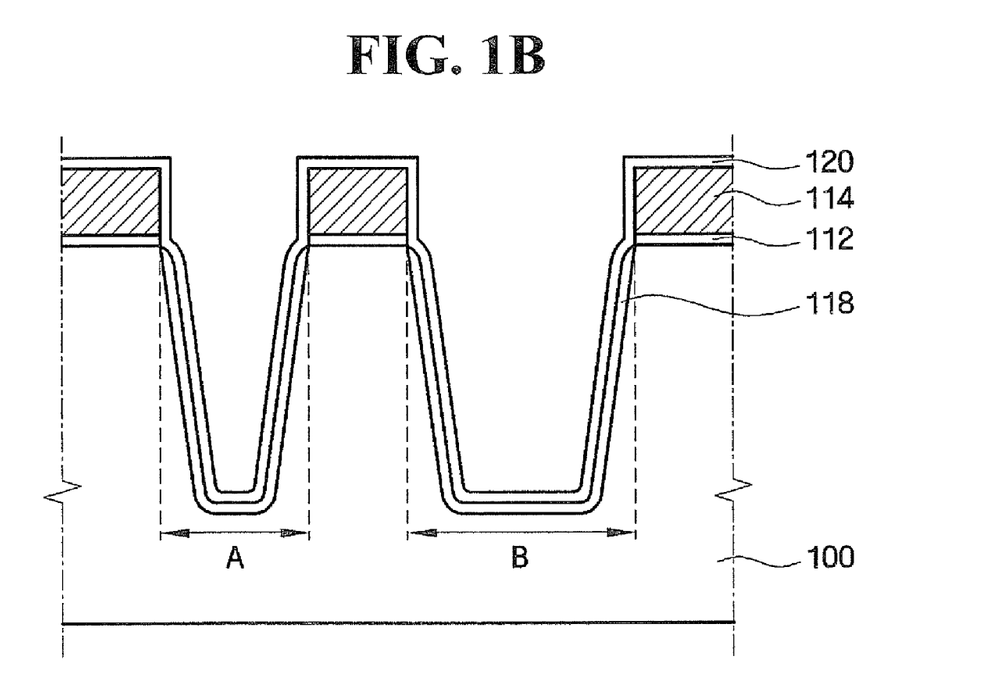
Figure 1C:
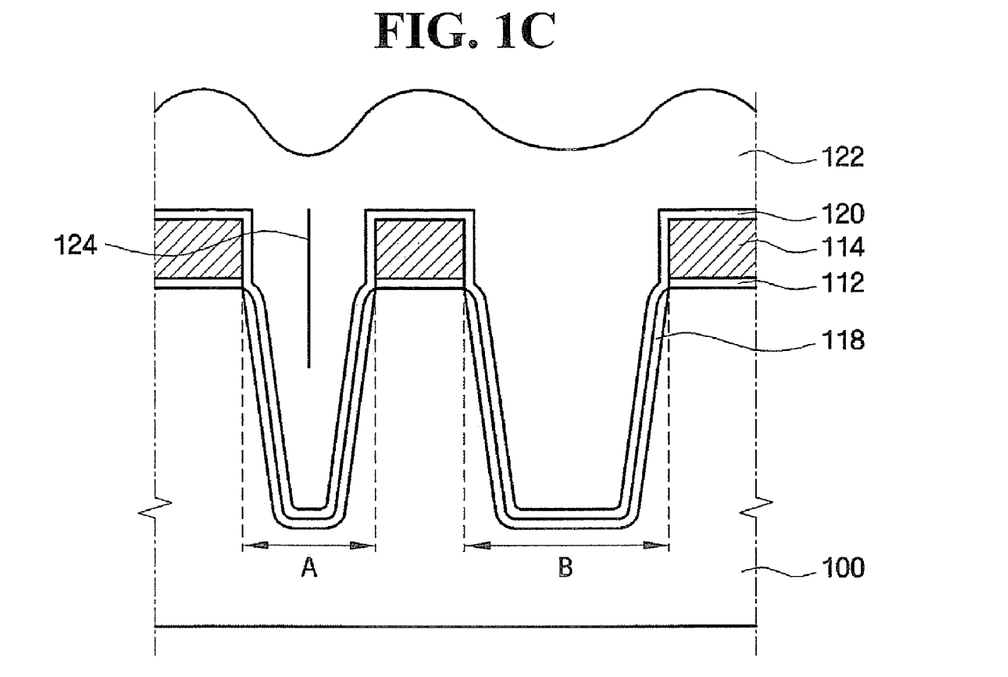

Referring to FIG. 1C, a gap-filling oxide layer 122 is deposited on the structure of FIG. 1B, so that the trenches are filled. In particular, a gap-filling oxide layer 122 is formed using a HARP (High Aspect Ratio Planarization) process. In this case, a material of the gap-filling oxide layer 122 may be a HARP $O_3$-TEOS (High Aspect Ratio Planarization $O_3$-Tetra Ethyl Ortho Silicate) material. While the flow amount of $O_3$-TEOS material may be significantly smaller than the general flow amount used to increase deposition rate, the process for forming the HARP $O_3$-TEOS film, which is used as the gap-filling oxide layer 122, is performed. The HARP $O_3$-TEOS film can be formed as a homogeneous nucleation layer having a small surface sensitivity. However, a seam may be formed in a gap-filling process due to the deposition characteristic of the HARP $O_3$-TEOS material. As illustrated, a seam 124 may be formed at an interface portion. In particular, the seam 124 may be formed in the trench A having a higher high aspect ratio. The seam 124 may cause the formation of a void, which can reduce device yield.

Figure 1D:
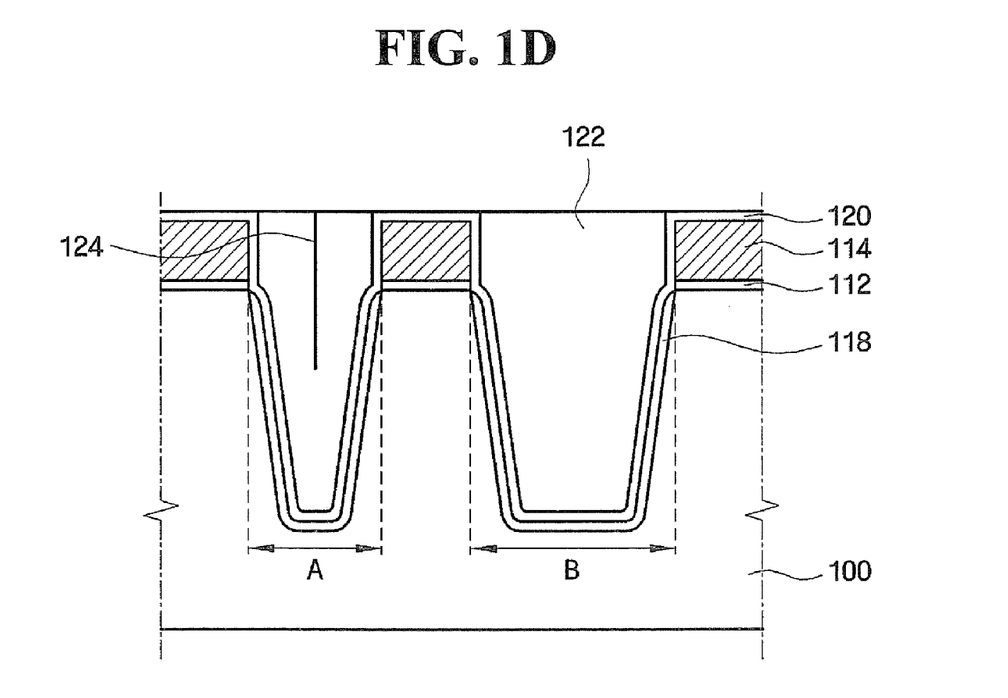
Figure 1E:
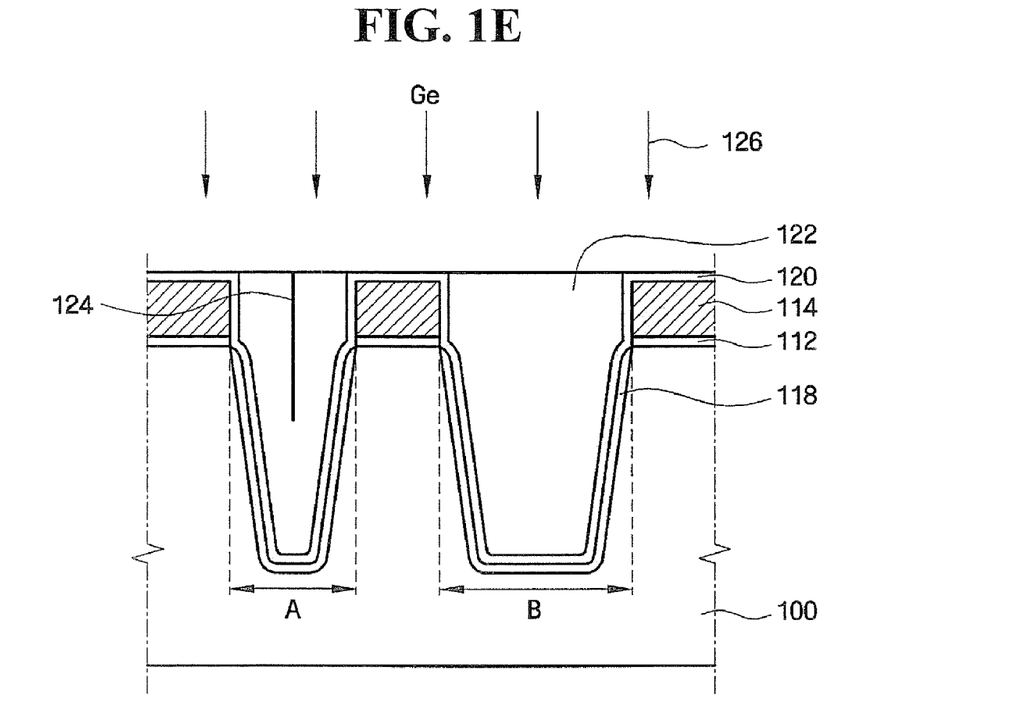

Referring to FIG. 1D, the gap-filling oxide layer 122 is then planarized. Before the gap-filling oxide layer 122 is planarized, a first thermal treatment (annealing) is performed. The first thermal treatment may be performed, for example, at a temperature of at least about 600° C. For example, the first thermal treatment may be performed at a temperature of about 1050° C. for a duration of at least about 30 minutes. The gap-filling oxide layer 122 may be planarized by a CMP (Chemical Mechanical Polishing) process. Even though the above-mentioned planarization process is performed, the seam 124 may still exist in the gap-filling oxide layer 122 having a high aspect ratio. To address this problem, curing ions may be implanted into the planarized gap-filling oxide layer 122, as illustrated by FIG. 1E. These curing ions 126 may be implanted into the planarized gap-filling oxide layer 122, so that the upper portion of the gap-filling oxide layer 122 is converted to a state having less atomic order, including an amorphous state.

In more detail, the curing ions 126 may be ions selected from Groups 3, 4, 5 and 8 of the periodic table of elements. For example, the curing ions 126 may be ions selected from a group consisting of nitrogen (N), phosphorus (P), boron (B), arsenic (As), carbon (C), argon (Ar), germanium (Ge), helium (He), neon (Ne) and xenon (Xe). Further, the implantation conditions differ depending on the type of curing ions. For example, the implantation condition may include an implantation energy of 80 KeV and a dose of $1\times10^{15}$ ions/cm$^2$. The implantation depth of the implanted curing ions 126 may be, for example, about 100 nm, but may be changed without departing from the scope and spirit of the present invention. The implantation depth may have any value as long as the seam 124 formed in the upper portion of the gap-filling oxide layer 122 can be at least partially removed.

Figure 1F:
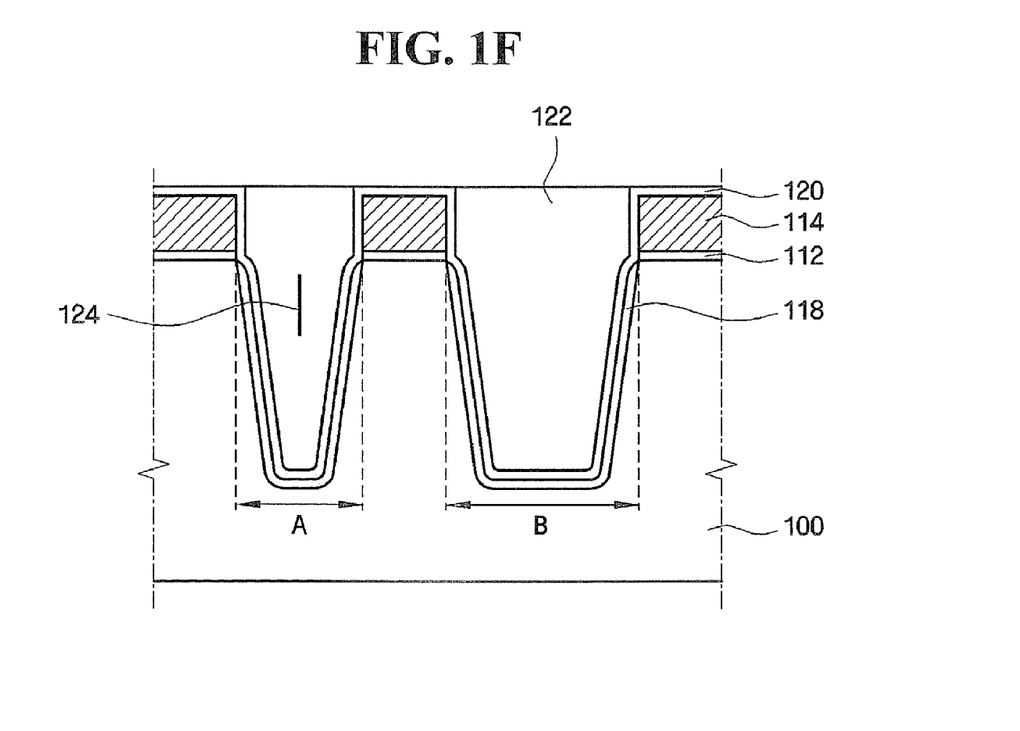

Referring to FIG. 1F, a second thermal treatment is performed on the gap-filling oxide layer 122 into which the curing ions are implanted. The second thermal treatment may be performed at a temperature of at least about 600° C. For example, the second thermal treatment may be performed at a temperature of about 1050° C. for about 30 minutes. Accordingly, it is possible to facilitate an increase in atomic order of silicon and oxygen in the upper portion of the gap-filling oxide layer 122. This increase in atomic order may include a partial or possibly complete recrystallization in the oxide layer 122. As a result, it is possible to change the upper portion of the gap-filling oxide layer 122, into which ions are previously implanted, from a possibly amorphous state to a more organized recrystallized state. Although not wishing to be bound to any theory, it is believed that the silicon and oxygen in the upper portion of the gap-filling oxide layer 122 are rebonded and then regularly arranged, so that the seam 124 formed in the upper portion of the gap-filling oxide layer 122 can be at least partially removed. Further, the upper portion of the gap-filling oxide layer 122 is changed from a less atomically ordered state to a more atomically ordered state, so that the gap-filling oxide layer 122 can become denser. Accordingly, the damage to the upper portion of the gap-filling oxide layer 122 can be physically cured.

Therefore, if the implantation of curing ions is performed and a thermal treatment is performed at a high temperature in accordance with the embodiment of the present invention, the upper portion of the gap-filling oxide layer 122 can be changed from a possibly amorphous state to a more highly crystalline state. For this reason, the seam formed in the upper portion of the gap-filling oxide layer 122 can be removed in the above-mentioned process. Further, since the upper portion of the gap-filling oxide layer 122 becomes denser, a wet etching rate with respect to HF may decrease.

Figure 1G:
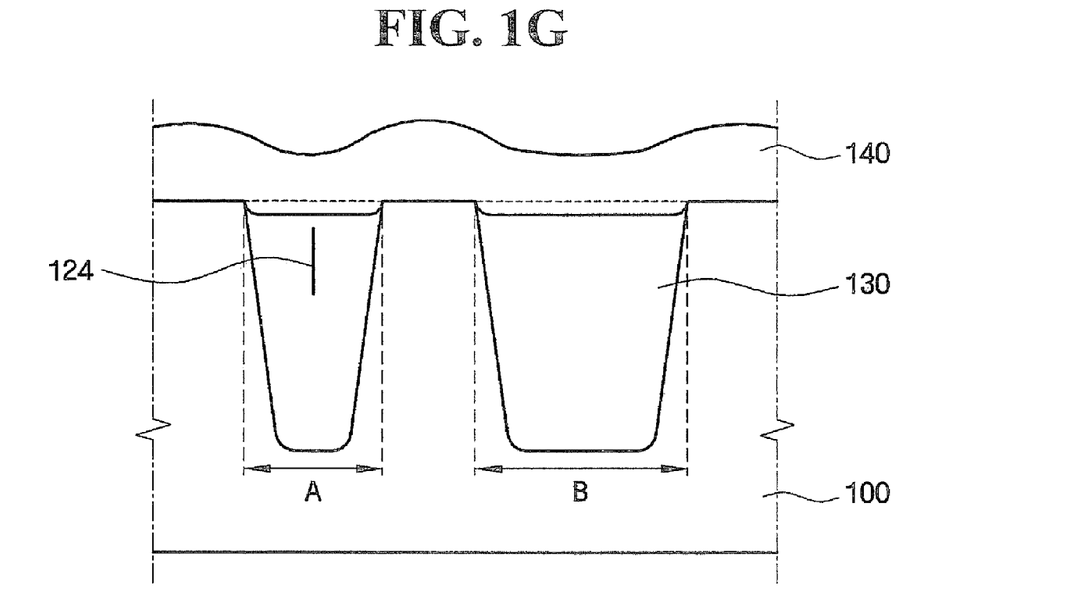

Subsequently, referring to FIG. 1G, the pad oxide film pattern 112 and the pad nitride film pattern 114 are removed, so that an element isolation region 130 is completed. The pad oxide film pattern 112 and the pad nitride film pattern 114, which are formed on the thermally treated semiconductor substrate 100, are removed by wet etching using an HF solution. In this case, since generally having a high wet etching rate with respect to an HF solution, a HARP $O_3$-TEOS film can be more deeply recessed in the above-mentioned process. However, as described above, the gap-filling oxide film 122 according to the embodiment of the present invention can be made denser through the implantation of the curing ions 126 and the thermal treatment process. Accordingly, the wet etching rate of the gap-filling oxide layer 122 according to the embodiment of the present invention with respect to an HF solution can become lower than a general HARP $O_3$-TEOS film. For this reason, the gap-filling oxide layer may have a recessed depth smaller than that of a general element isolation film.

Next, a nitride film 140 is formed on the entire surface of the product structure formed as described above. The nitride film 140 may be used as an etch stop film, but is not limited thereto. An interlayer insulating film (not shown) may also be formed after the formation of the nitride film 140.

Figure 2:
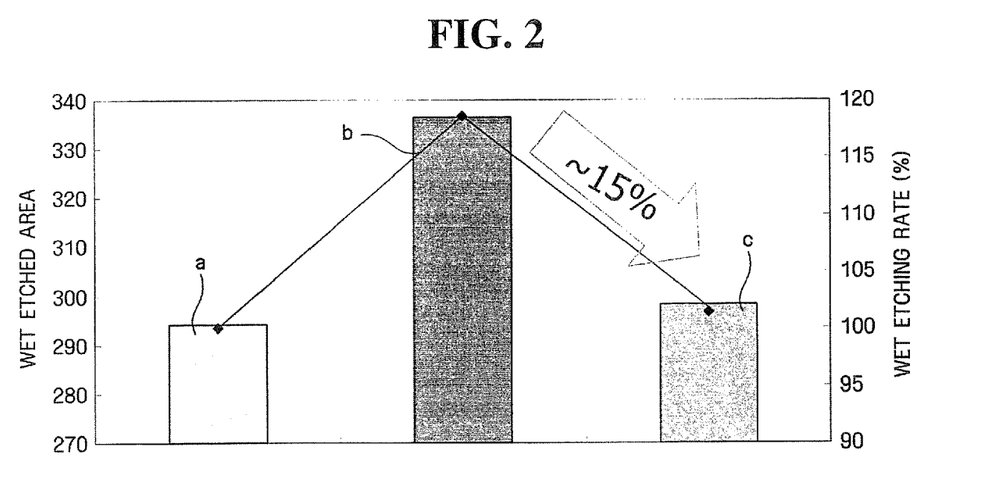
FIG. 2 shows graphs of wet etching rates of experimental examples on which an HDP process, a HARP process, and a process of an embodiment of the present invention are performed, respectively.

FIG. 2 illustrates a comparison of experimental etch rates using an HDP process, a HARP process and a process according to an embodiment of the invention. In particular, a graph "a" corresponds to a case where a trench having a high aspect ratio is filled using an HDP oxide film process and the nitride film pattern is removed by an HF solution in order to form the element isolation film. Graph "b" corresponds to a case where the element isolation film is formed by filling a trench having a high aspect ratio with the HARP $O_3$-TEOS film, performing the first thermal treatment at a temperature of 1050° C. for about 30 minutes, planarizing the HARP $O_3$-TEOS film, performing the second thermal treatment at a temperature of about 900° C. for about 30 minutes, and removing the nitride film pattern with an HF solution. Finally, graph "c" corresponds to a case where the element isolation film is formed by filling the trench having a high aspect ratio with the HARP $O_3$-TEOS film, performing the first thermal treatment at a temperature of 1050° C. for about 30 minutes, planarizing the HARP $O_3$-TEOS film, implanting Ge ions into the planarized HARP $O_3$-TEOS film, performing the second thermal treatment at a temperature of about 1050° C. for about 30 minutes, and removing the nitride film pattern with an HF solution. Thus, graph "a" corresponds to a case where the element isolation film is formed using a HDP process, graph "b" corresponds to a case where the element isolation film is formed using a general HARP $O_3$-TEOS process, and graph "c" corresponds to a case where the element isolation film is formed using the HARP $O_3$-TEOS process according to the embodiment of the present invention.

In FIG. 2, a left Y-axis indicates a wet etched area of the element isolation film corresponding to each of the processes (a, b, c) with respect to the HF solution, and a right Y-axis indicates a wet etching rate with respect to the HF solution. Referring to FIG. 2, assuming that the wet etching rate corresponding to the graph "a" with respect to the HF solution is 100%, it is understood that the wet etching rate corresponding to the graph "b" is 117% and the wet etching rate corresponding to the graph "c" is 102%. Accordingly, when the element isolation film is formed using the HARP $O_3$-TEOS process according to the embodiment of the present invention, the wet etching rate with respect to the HF solution is decreased by 15% as compared to when the element isolation film is formed using a general HARP $O_3$-TEOS process.

Figure 3A:
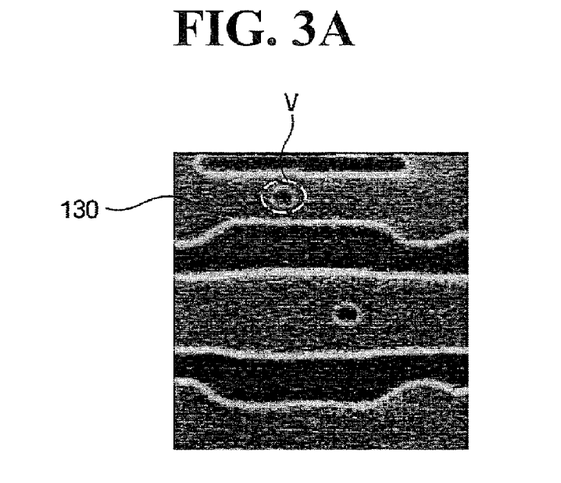
FIGS. 3A to 3C show comparative samples of a semiconductor device and an experimental example of a semiconductor device according to an embodiment of the present invention.
Figure 3B:
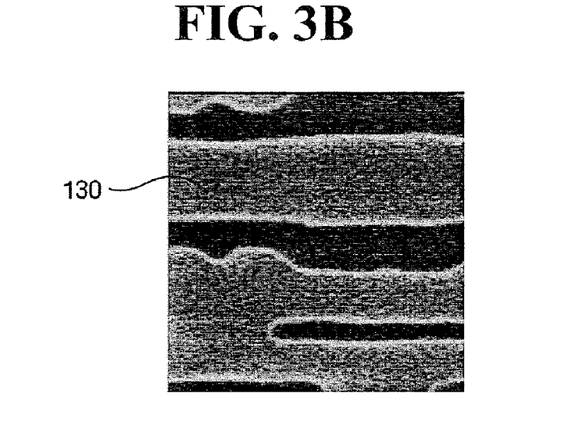
Figure 3C:
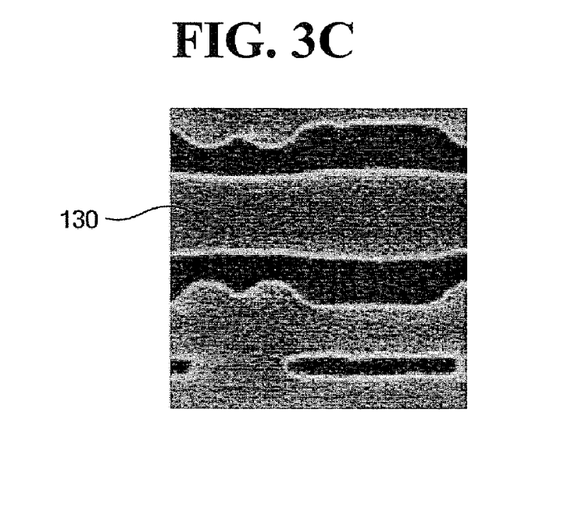

FIG. 3A shows a semiconductor device corresponding to the graph "a" of FIG. 2. Referring to FIG. 3A, it is understood that voids are formed in the element isolation film 130. FIGS. 3B and 3C show a semiconductor device corresponding to graph "c" of FIG. 2. In particular, a Ge ion implantation process of FIG. 3B corresponds to a case when the implantation energy is large and a dose is large. For example, Ge ion implantation energy is 80 KeV, and a dose is $1 \times 10^{15}$ ions/cm$^2$. Meanwhile, a Ge ion implantation process of FIG. 3C corresponds to a case when the implantation energy is large and a dose is small. For example, Ge ion implantation energy is 80 KeV, and a dose is $5 \times 10^{14}$ ions/cm$^2$. In the case of FIGS. 3B and 3C, it is understood that a void caused by a seam is not formed in the element isolation film 130. Thus, it is possible to at least partially remove the seam 124 formed in the upper portion of the gap-filling oxide film 122 by implanting Ge ions into the gap-filling oxide film 122 and performing the thermal treatment in accordance with an embodiment of the present invention. Further, since the seam 124 is partially removed, it is understood that it is possible to prevent the voids from being formed in the element isolation film.

Figure 4A:
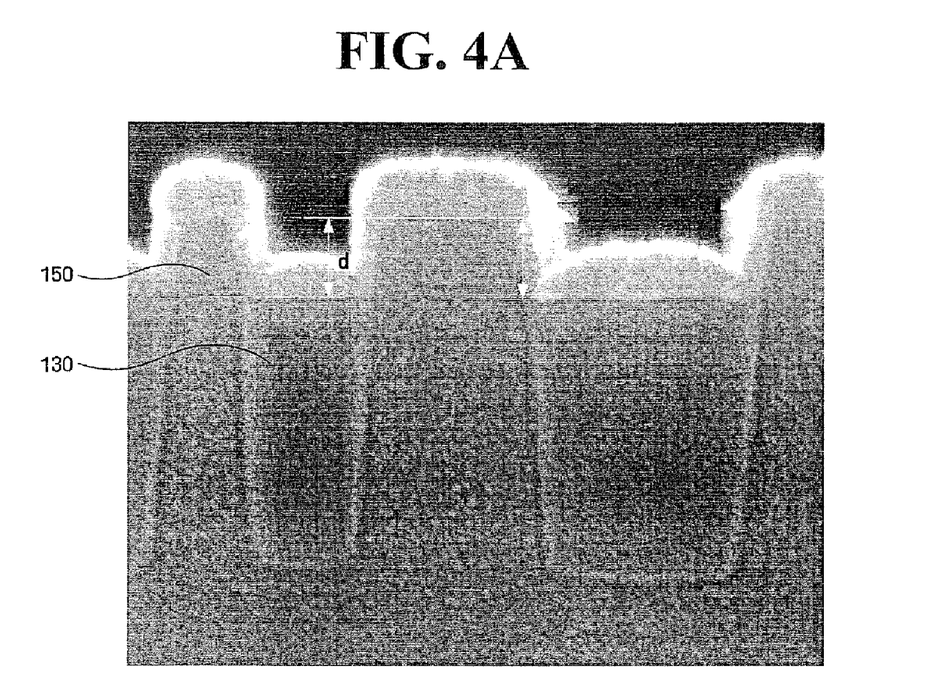
FIGS. 4A and 4B are cross-sectional views of a comparative sample semiconductor device and a semiconductor device according to an embodiment of the present invention.
Figure 4B:
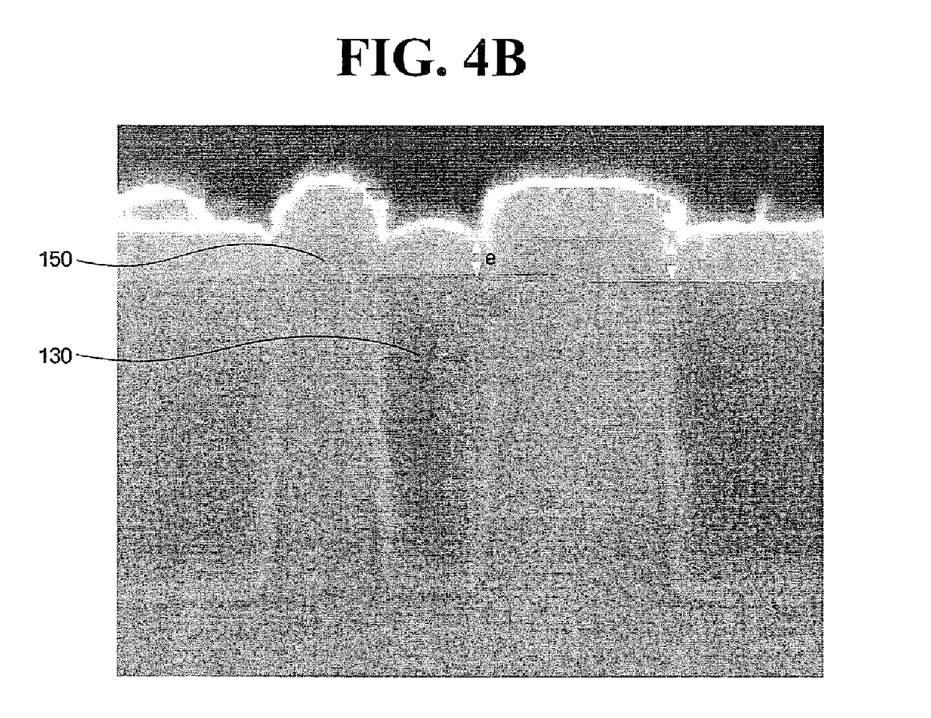

FIGS. 4A and 4B are cross-sectional views of a comparative sample semiconductor device and a semiconductor device according to an embodiment of the present invention. FIG. 4A is a cross-sectional view of a semiconductor device with a trench having a high aspect ratio, which is formed by a general HARP $O_3$-TEOS oxide film process. Further, FIG. 4B is a cross-sectional view of a semiconductor device with a trench having a high aspect ratio, which is formed by a HARP $O_3$-TEOS oxide film process according to an embodiment of the present invention. Referring to FIG. 4A, it is understood that the element isolation film 130 is deeply recessed from an active region 150 so as to have a depth d. In this case, the depth d is 67 nm. However, referring to FIG. 4B, it is understood that the element isolation film 130 is recessed from an active region 150 so as to have a depth e smaller than a general depth. In this case, the depth d is 31 nm. Accordingly, when a semiconductor device is manufactured using a HARP $O_3$-TEOS oxide film process according to an embodiment of the present invention, the film can be cured by the implantation of curing ions and a thermal treatment. Further, since the film becomes physically dense, a wet etching rate with respect to an HF wet etching solution is decreased.

Although the present invention has been described in connection with the exemplary embodiments of the present invention, it will be apparent to those skilled in the art that various modifications and changes may be made thereto without departing from the scope and spirit of the invention.

What is claimed is:

1. A method of forming an integrated circuit device, comprising:
    forming a trench in a surface of semiconductor substrate;
    filling the trench with an electrically insulating region having a seam therein by depositing an electrically insulating layer on sidewalls and a bottom of the trench;
    implanting curing ions into the electrically insulating region at a sufficient energy and dose to reduce a degree of atomic order therein, said implanting comprising implanting germanium ions at an energy of at least about 80 KeV and at a dose of at least about $5 \times 10^{14}$ ions/cm$^2$; and
    annealing the electrically insulating region and curing ions therein at a sufficient temperature and for a sufficient duration to increase a degree of atomic order therein.

2. The method of claim 1, wherein said implanting step is preceded by a step of planarizing a surface of the electrically insulating region; and wherein said implanting step comprises implanting curing ions into the planarized surface of the electrically insulating region.

3. The method of claim 1, wherein said annealing step comprises annealing the electrically insulating region at a temperature of at least about 600° C.

4. A method of forming an integrated circuit device, comprising:
    forming a trench in a surface of semiconductor substrate;
    filling the trench with an electrically insulating region having a seam therein by depositing an electrically insulating layer on sidewalls and a bottom of the trench;
    implanting curing ions into the electrically insulating region at a sufficient energy and dose to reduce a degree of atomic order therein; and
    annealing the electrically insulating region and curing ions therein at a sufficient temperature and for a sufficient duration to increase a degree of atomic order therein;
    wherein said annealing step comprises annealing the electrically insulating region at a temperature of about 1050° C. for about 30 minutes.

5. The method of claim 2, wherein said planarizing step is preceded by a step of annealing the electrically insulating region to increase a degree of atomic order therein.

6. The method of claim 1, wherein the electrically insulating layer is a HARP $O_3$-TEOS layer.

7. A method of forming an integrated circuit device, comprising:

forming a trench in a surface of a semiconductor substrate;

filling the trench with an electrically insulating region having a seam therein by depositing an electrically insulating layer on sidewalls and a bottom of the trench;

implanting curing ions, which are selected from a group consisting of nitrogen, phosphorus, boron, arsenic, carbon, argon, germanium, helium, neon and xenon, into the electrically insulating region at a sufficient energy and dose to reduce a degree of atomic order therein, said implanting comprising implanting the curing ions at an energy of at least about 80 KeV and at a dose of at least about $5\times10^{14}$ ions/cm$^2$; and annealing the electrically insulating region and curing ions therein at a temperature of at least about 600° C. and for a sufficient duration to increase a degree of atomic order therein.

* * * * *